(12) United States Patent
Wieczorek et al.

(10) Patent No.: US 6,995,027 B2
(45) Date of Patent: Feb. 7, 2006

(54) INTEGRATED SEMICONDUCTOR STRUCTURE FOR RELIABILITY TESTS OF DIELECTRICS

(75) Inventors: Karsten Wieczorek, Dresden (DE); Rolf Geilenkeuser, Dresden (DE); Jörg-Oliver Weidner, Moritzburg (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/649,051

(22) Filed: Aug. 27, 2003

(65) Prior Publication Data

US 2004/0188678 A1    Sep. 30, 2004

(30) Foreign Application Priority Data

Mar. 31, 2003  (DE)  ................................ 103 14 503

(51) Int. Cl.
*G01R 31/26*    (2006.01)

(52) U.S. Cl. .............................. 438/18; 438/17; 438/11

(58) Field of Classification Search ................ 257/491; 438/17, 11, 18
See application file for complete search history.

(56) References Cited

U.S. PATENT DOCUMENTS

| | | | | |
|---|---|---|---|---|
| 5,081,998 A | * | 1/1992 | Yelderman et al. | ......... 600/532 |
| 6,281,511 B1 | * | 8/2001 | Thakur | ..................... 250/492.2 |
| 6,465,266 B1 | * | 10/2002 | Yassine et al. | ................ 438/17 |
| 6,472,233 B1 | | 10/2002 | Ahmed et al. | ................ 438/14 |
| 6,684,694 B2 | * | 2/2004 | Fujiwara et al. | ......... 73/204.26 |
| 6,763,710 B2 | * | 7/2004 | Mayer et al. | ............ 73/204.11 |
| 6,825,543 B2 | * | 11/2004 | Shimotsusa et al. | ........ 257/491 |
| 2002/0033710 A1 | | 3/2002 | Kim | .......................... 324/765 |

FOREIGN PATENT DOCUMENTS

DE    100 10 285 A1    9/2001

OTHER PUBLICATIONS

Kim et al., "Breakdown Phenomena in MIS Structure," *Proc. Of 3$^{rd}$ Int'l Conf. on Properties and Application of Dielectric Materials*, Tokyo, Japan, pp. 164-168, Jul. 8-12, 1991.

Shanware et al., "Reliability evaluation of HiSiON gate dielectric film with 12.8 Å SiO$_2$ equivalent thickness," *IEEE*, pp. 6.6.1-6.6.4, 2001.

Abadeer et al., "Key measurements of ultrathin gate dielectric reliability and in-line monitoring," *IBM J. Res. Develop.*, 43:407-16, 1999.

* cited by examiner

*Primary Examiner*—Michael Lebentritt
*Assistant Examiner*—Andre' Stevenson
(74) *Attorney, Agent, or Firm*—Williams, Morgan & Amerson, P.C.

(57) ABSTRACT

A test structure for assessing the reliability of a dielectric of a circuit element in an integrated circuit includes a plurality of test circuit elements and a plurality of contact pads, wherein at least some of the test circuit elements share one or more of the contact pads. In this way, a failure event can be detected with a reduced number of contact pads, thereby significantly reducing the area of floor space occupied by the test structure.

8 Claims, 6 Drawing Sheets

INTEGRATED SEMICONDUCTOR STRUCTURE FOR RELIABILITY TESTS OF DIELECTRICS

BACKGROUND OF THE INVENTION

1. Field of the Invention

Generally, the present invention relates to the fabrication of integrated circuits, and, more particularly, to a technique of monitoring and testing the reliability of circuit elements, such as field effect transistors, with respect to the lifetime of these elements.

2. Description of the Related Art

In modern integrated circuits, feature sizes of individual circuit elements, such as transistors, resistors, capacitors and the like, are steadily decreased to improve the device performance in terms of operational speed and/or power consumption. The continuous reduction in size of the circuit elements, however, is usually not a straightforward development and may require significant effort in adapting process techniques to achieve the target design dimensions. Additionally, the shrinkage of certain circuit elements or parts thereof usually entails a corresponding scaling of other circuit parts, thereby creating a plurality of issues that have to be dealt with. For example, the continual reduction of the channel length of field effect transistors, i.e., the distance between the source and the drain region of the transistor, typically requires the gate insulation layer, i.e., the dielectric layer electrically insulating the gate electrode from an underlying channel region, to be reduced in thickness so as to produce the necessary capacitive coupling between the gate electrode and the channel region as is required for proper control of the transistor function.

Currently, integrated circuits such as CPUs are fabricated on the basis of CMOS technology, producing transistors having a gate length in the range of approximately 0.1 $\mu$m and less. The devices having a channel length on this order of magnitude may require a gate insulation layer having a thickness of 2–3 nm when the dielectric material is silicon dioxide, possibly including a certain amount of nitrogen. For further device scaling, the thickness of silicon dioxide based gate insulation layers may even require dimensions that are significantly less than the above-specified range. As a consequence, the formation of ultra-thin gate insulation layers having reliable and predictable characteristics over a specified lifetime of the circuit element under consideration is a challenging task for semiconductor manufacturers. Although alternative materials and process techniques for manufacturing gate insulation layers appropriate for extremely scaled transistor devices have been proposed, it is nevertheless essential that the characteristics of the gate insulation layer be thoroughly monitored so as to be able to comply with product specifications established for a certain type of product.

In addition to the gate insulation layer thickness, other parameters, such as gate dopant concentration and well dopant concentration, also have a tremendous impact on the finally achieved dielectric breakdown of a transistor element and, thus, on the reliability and expected lifetime of the entire integrated circuit. Reliability is important because the failure of a single transistor element may cause a catastrophic failure of the entire device. For this reason, monitoring the time to dielectric breakdown of selected transistor elements has become a standard means for monitoring and assessing the reliability of gate dielectrics used in gate insulation layers. A meaningful accurate reliability assessment, however, requires the availability of a sufficient number of test devices to allow a quantitatively well-based statement on the expected lifetime of the devices. Consequently, multiple test structures are required on every product wafer so as to reliably estimate and assess the time to dielectric breakdown of the test devices. As previously pointed out, in manufacturing high performance integrated circuits, process amendments for optimizing and adapting process parameters are frequently necessary and even further emphasize the necessity for accurate reliability assessments, since at least some of the process changes may potentially impact the reliability of the devices.

Figure 1A:
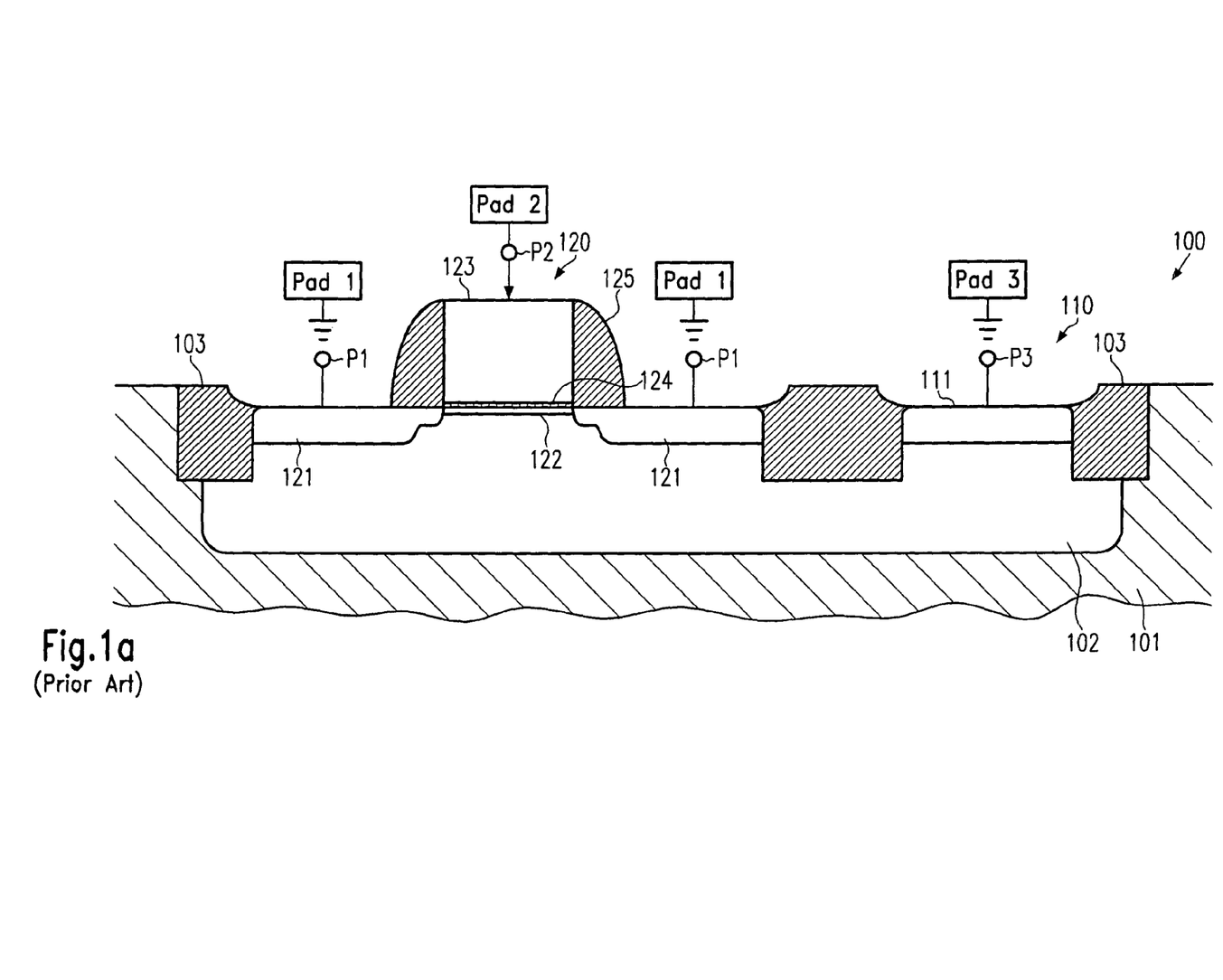
FIGS. 1a–1b schematically show a cross-sectional view and a top view, respectively, of a conventional test structure for estimating the reliability of a gate insulation layer.

With reference to FIGS. 1a–1d, a conventional test structure as is implemented in large numbers on a product substrate will now be described in more detail. FIG. 1a schematically shows a cross-sectional view of an integrated transistor test structure that enables the monitoring of the time to dielectric breakdown of a single transistor device formed in accordance with a specific type of transistor as also used on product areas of the substrate. A test structure 100 comprises a substrate 101, for example a silicon substrate, in which a lightly doped semiconductor region 102 is formed, which is hereinafter referred to as the "well region." Moreover, in the example, an N-channel transistor will be described and, therefore, the well region 102 is provided as a P-well region. A trench isolation structure 103 formed in the substrate 101 separates a well contact 110 and a transistor structure 120 from each other. The well contact 110 comprises a highly doped semiconductor layer 111 that acts as an electrode for electrically connecting to the well region 102.

The transistor structure 120 comprises highly doped source and drain regions 121, which are separated by a channel region 122 that forms a conductive channel upon application of an appropriate voltage to a gate electrode 123. The gate electrode 123 may be comprised of any appropriate conductive material and may, according to sophisticated CMOS techniques, comprise highly doped polysilicon. Since the transistor structure 120 is to represent an N-channel transistor, the source and drain regions 121 and the gate electrode 123 may be doped by N-type dopants. Sidewall spacers 125 may be formed on sidewalls of the gate electrode 123 and a gate insulation layer 124 separates the channel region 122 from the gate electrode 123. As previously noted, the gate insulation layer 124 may be of a complex structure, i.e., may include various materials having a high permittivity, and/or may have an extremely small thickness of 2 nm and even less. Consequently, any variations during manufacturing of the gate insulation layer 124, variations of the dopant concentrations of the gate electrode 123 and of the well region 102, the dopant profile of which may require a complex succession of implantation sequences, and variations during operation of the device may lead to significant variations in the lifetime of the gate insulation layer 124.

Furthermore, for the sake of simplicity, other components of the test structure 100, such as silicide regions formed in the drain and source regions 121 and the gate electrode 123, as well as contact plugs formed on the drain and source regions 121, the gate electrode 123 and the well contact 110, are not shown in FIG. 1a so as to not unduly obscure the principals of the test structure 100. Furthermore, any metallization layers, i.e., layers including conductive vias and lines for interconnecting individual circuit elements, are not shown in FIG. 1a but may form a part of the test structure 100.

Figure 1B:
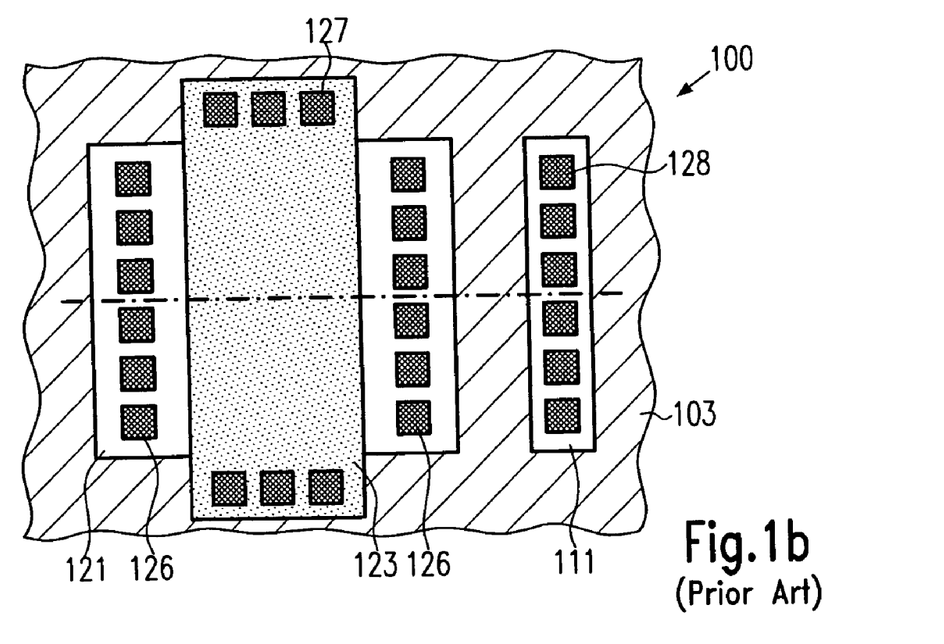

FIG. 1b schematically shows a top view of the structure 100 with contact plugs 126 for connecting to the source and drain region 121, contact plugs 127 connecting to the gate electrode 123, and contact plugs 128 connecting to the well contact 110. The contact plugs 126 may finally be connected to a metal pad formed on top of the final metallization layer (not shown), wherein the total number of metallization layers may depend on the specific design of the test structure 100. Since typically the test structure 100 is formed on a product substrate 101, the test structure 100 is commonly manufactured with the devices on the product chip areas. Accordingly, the design and the number of the metallization layers are dictated by the product chips formed on the substrate 101. For convenience, the metal pad connected to the contact plugs 126 may be referred to as pad 1 and may have dimensions that allow contact of the pad 1 by an appropriate electrode of a test tool. Similarly, the contact plugs 127 are finally connected to a further metal pad, referred to as pad 2, and the contact plugs 128 are connected to a third metal pad, referred to as pad 3.

Again referring to FIG. 1a, the combination of contact plugs and conductive lines formed in any metallization layer, and the corresponding metal pads 1, 2 and 3 may be illustrated in FIG. 1a in a simplified manner and may be indicated as terminals p1, p2 and p3, respectively. Thus, p1 represents an electrical connection from the drain and source regions to the metal pad 1, wherein, for example, an electrical connection between the two drain and source regions 121 may be established in the first metallization layer and a single connection may then be formed from the metallization layer 1 to the contact pad 1. Similarly, the terminal p2 represents the electrical connection from the gate electrode 123 to the metal pad 2, and the terminal p3 represents the electrical connection from the well contact 110 to the metal pad 3.

A typical process flow for forming the test structure 100 as shown in FIG. 1a may comprise conventional and well-established manufacturing processes to form the transistor structure 120 and the well contact 110. Thus, a detailed description thereof is omitted herein. After completion of the transistor structure 120 and the well contact 110, as illustrated in a simplified manner in FIG. 1a, one or more metallization layers may be formed in accordance with well-established process steps wherein, for instance, the source and drain regions 121 are shorted by a corresponding metal line (not shown). Thereafter, the one or more metallization layers are completed and the metal pads 1, 2 and 3 are formed so as to be accessible by a test device. It should be noted that the dimensions of the metal pads 1, 2 and 3 are significantly larger than those of the associated test structure 100 and therefore a large amount of valuable chip area is consumed by the metal pads 1, 2 and 3.

During operation, a ground potential is applied to the terminals p1 and p3, that is, to the contact pads 1 and 3, whereas a positive voltage is applied to terminal p2 with a magnitude that insures the formation of an inversion channel in the channel region 122. Usually, the voltage applied to the terminal p2 and thus to the gate electrode 123 is significantly increased compared to normal operation conditions to reduce the time required for occurrence of electrical breakdown events. During application of the gate voltage, the environmental conditions of the test structure 100 may be chosen so as to resemble typical environmental conditions during operation of the semiconductor device under consideration. While applying the gate voltage to the gate electrode 123, the leakage current flowing from the gate electrode 123 into the channel region 122 is steadily monitored. Upon occurrence of a dielectric breakdown, the leakage current significantly increases and the time interval may be used to assess the lifetime of the actual device under consideration.

Figure 1C:
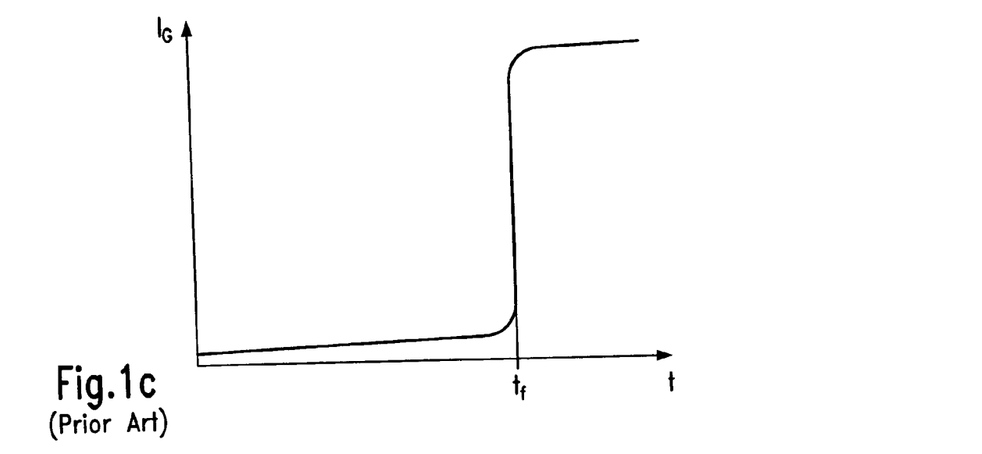
FIG. 1c shows a graph depicting the relationship between the time to failure and the leakage current.

FIG. 1c schematically shows a graph representing the gate leakage current indicated as $I_g$ versus the time of application of the gate voltage. As is shown, at time point $T_f$, an electrical breakdown of the gate insulation layer 124 occurs and consequently a significantly higher leakage current $I_g$ is drawn.

As previously pointed out, a plurality of test structures 100 is typically required for a specific type of circuit element to be tested in order to be able to carry out a thorough analysis and to obtain meaningful statistical results. Consequently, approximately 30–100 test structures 100 are usually provided for a specified type of circuit element, thereby requiring thrice a certain number of metal pads 1, 2 and 3. As these metal pads consume significant chip area owing to the relatively large dimensions thereof, only a reduced number of saleable products may be formed on the substrate 101.

In view of the above-identified problems, a need exists to provide a technique for monitoring electrical breakdown events on a substrate with required statistical relevance while reducing the floor space consumed by respective test structures.

SUMMARY OF THE INVENTION

Generally, the present invention is directed to a technique that enables the reduction of the number of metal pads required for the detection of a failure event. This is achieved in that a plurality of devices under test are provided per each test structure and at least two of the plurality of devices in the test structure are connected to respective common contact pads. A respective failure of one of the plurality of devices under test may then be identified by multiple step-like changes in a monitor signal, such as a gate leakage current. In this way, the number of pads required for a single failure event is reduced and enables the formation of a required number of test devices within a reduced floor space as compared to the conventional approach requiring three contact pads per failure event.

According to one illustrative embodiment of the present invention, an integrated semiconductor structure for testing a dielectric comprises a plurality of circuit elements, wherein each circuit element includes a first conductive region and a second conductive region separated by a dielectric layer. Moreover, each of the first conductive regions is electrically connected to a first common contact pad and each of the second conductive regions is electrically connected to a second common contact pad.

According to a further illustrative embodiment of the present invention, an integrated semiconductor structure for testing a dielectric comprises at least two circuit elements, each having a first electrode, a second electrode, a third electrode and a dielectric layer disposed adjacent to the first, second and third electrodes. A first contact pad is electrically connected to the first and second electrodes of the circuit elements. A second contact pad is electrically connected to the third electrodes of the circuit elements. A third contact pad is electrically connected to a semiconductive region in which the circuit elements are at least partially formed.

According to still a further illustrative embodiment of the present invention, an integrated semiconductor structure for testing a dielectric comprises a plurality of transistor elements, wherein source and drain regions and a gate electrode of at least one transistor element are commonly electrically connected to a first contact pad. Moreover, a well region in which the transistor element is formed is electrically connected to a second contact pad.

In accordance with another embodiment of the present invention, an integrated semi-conductor structure for testing a dielectric comprises an N-channel transistor structure and a P-channel transistor structure. A first contact pad is connected to gate electrodes and drain and source regions of the P-channel and N-channel transistor structures. A second contact pad is connected to a P-well of the N-channel transistor structure and a third contact pad is connected to an N-well of the P-channel transistor structure.

According to still a further illustrative embodiment of the present invention, a method comprises commonly connecting first conductive regions of a plurality of circuit elements of a semiconductor structure with a first electric potential via a common first contact pad. The method further includes commonly connecting second conductive regions of the plurality of circuit elements of the semiconductor structure with a second electric potential via a common second contact pad, wherein the first and second conductive regions are insulated from each other by a dielectric. Finally, reliability of the dielectric is assessed by determining failure events of the circuit elements.

In a further embodiment of the present invention, a method comprises commonly connecting source and drain regions of a plurality of transistor elements to a first electric potential by a first contact pad and commonly connecting gate electrodes of the plurality of transistor elements to a second electric potential by a second contact pad. A common well region of the plurality of transistor elements is connected to a third electric potential by a third contact pad. Finally, reliability of gate insulation layers of the plurality of transistor elements is assessed by monitoring a gate leakage current of the plurality of transistor elements.

In still a further embodiment of the present invention, a semiconductor test structure comprises a plurality of test circuit elements, each including a dielectric layer to be tested, and a plurality of contact pads configured to connect an external measurement instrument to the plurality of test circuit elements. Moreover, a design of interconnects providing electrical connection between the contact pads and the test circuit elements provides a ratio of the number of test circuit elements to the number of contact pads is higher than 1:3.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

According to the inventors' finding, the number of contact pads per failure event in a test structure may significantly be reduced in that two or more circuit elements share one or more contact pads. Since individual failure events may be reliably identified in a failure signal that is commonly generated by the plurality of circuit elements to be tested, a statistical result of high relevance can be obtained with a significantly reduced number of contact pads and thus with a significantly reduced floor space required for the test structures. In the following illustrative embodiments of the present invention, test structures including two or more transistor structures are described, the various terminals of which may be partially connected to shared contact pads. The provision of the circuit elements to be tested in the form of transistor elements may often be advantageous to assess the reliability, i.e., the time to failure under predefined operating conditions of the test structure, wherein not only the dielectric layer under consideration formed in the test structure and in product circuit elements are substantially identical, but also most of the further process steps involved in fabricating the transistor structures in product areas and the test structures, such as implantation sequences, anneal cycles, sidewall spacer formation, and the like, are substantially identical. However, in other embodiments, it may be considered appropriate to form specially designed test circuits, for example in the form of capacitors and the like, so as to estimate the reliability of a dielectric layer, since usually in sophisticated integrated circuits these dielectric layers, typically provided in the form of a gate insulation layer, represent one of the most critical—and hence lifetime determining—components of the integrated circuits.

Figure 2A:
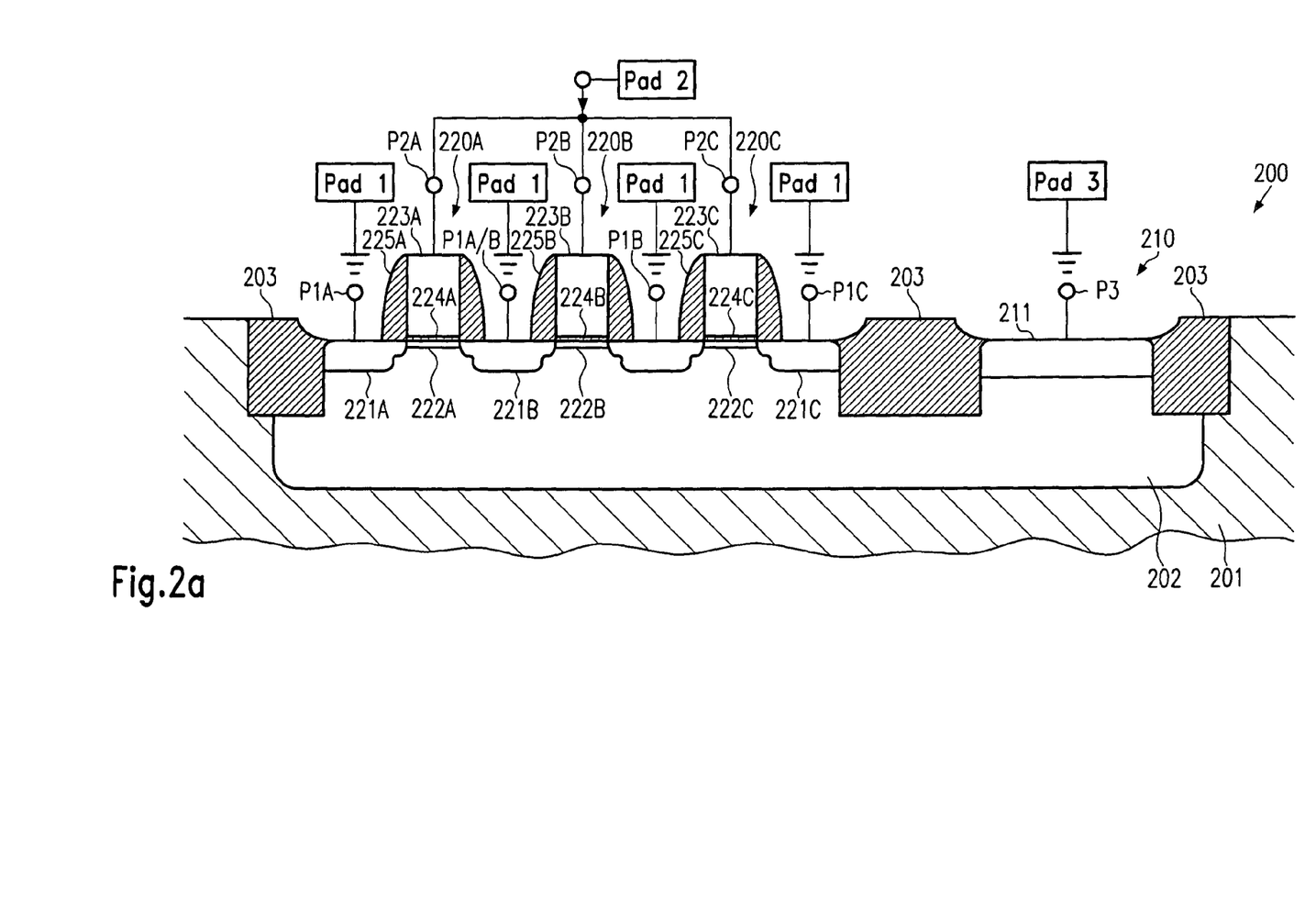
FIGS. 2a–2b show a cross-sectional view and a top view, respectively, of an integrated semiconductor structure for testing the reliability of a dielectric layer according to illustrative embodiments of the present invention.

With reference to FIGS. 2a–2d, further illustrative embodiments of the present invention will now be described. In FIG. 2a, a semiconductor structure 200 comprises a substrate 201, which may be any appropriate substrate for forming an integrated circuit thereon, such as a silicon substrate, a germanium substrate, an insulating substrate bearing a semiconductive layer, such as a silicon-on-insulator (SOI) substrate, or any other appropriate III-V or II-VI semiconductor substrates. In the substrate 201 or in any appropriate semiconductor layer formed thereon, a well region 202 is formed and includes an isolation structure 203.

In advanced integrated circuits, the isolation structure 203 is typically provided as a trench isolation, as shown in FIG. 2a. However, any other isolation structure considered appropriate, such as LOCOS isolation structures, may be used in accordance with design requirements. The isolation structure 203 separates the semiconductor structure 200 from neighboring substrate areas, which may bear further semiconductor structures similar to the structure 200 or which may include regular circuit elements. Moreover, the isolation structure 203 separates a well contact 210 including a highly doped contact layer 211 from a plurality of test circuit elements 220a, 220b, 220c that may be provided, for instance, in the form of transistor structures. Although the structure 200 in FIG. 2a is shown to include three test circuit elements 220a, 220b and 220c, the present invention is not restricted to this number and two, three or more test circuit elements may be provided, wherein the savings on floor space on the substrate 201 increases as the number of circuit elements in the test structure 200 increases. Moreover, although transistors are depicted as the test circuit elements in the disclosed embodiment, those skilled in the art will recognize after a complete reading of the present application that the test circuit elements may take other forms, such as, for example, capacitors and memory cells.

Each of the test circuit elements 220a, 220b, and 220c includes a channel region 222a, 222b, 222c, respectively, that separates respective source and drain regions 221a, 221b, and 221c, as is shown in FIG. 2a. Neighboring circuit elements share respective drain and source regions so that, for example, the test circuit elements 220a and 220b share the drain region 221b. In other embodiments, the isolation structure 203 may be modified so as to separate the individual circuit elements 220a, 220b and 220c by forming respective isolation trenches therebetween. Moreover, respective gate electrodes 223a, 223b and 223c are formed over the associated channel regions and are separated therefrom by respective gate insulation layers 224a, 224b and 224c. Sidewall spacers 225a, 225b, 225c are formed on the sidewalls of the respective gate electrodes. Moreover, as previously pointed out with reference to the conventional test structure shown in FIGS. 1a–1b, when the test structure 200 is a silicon based test structure formed according to a high performance CMOS process technology, silicide regions may be provided in the respective gate electrodes 223a, 223b, 223c and the drain and source regions 221a, 221b and 221c.

Figure 2B:
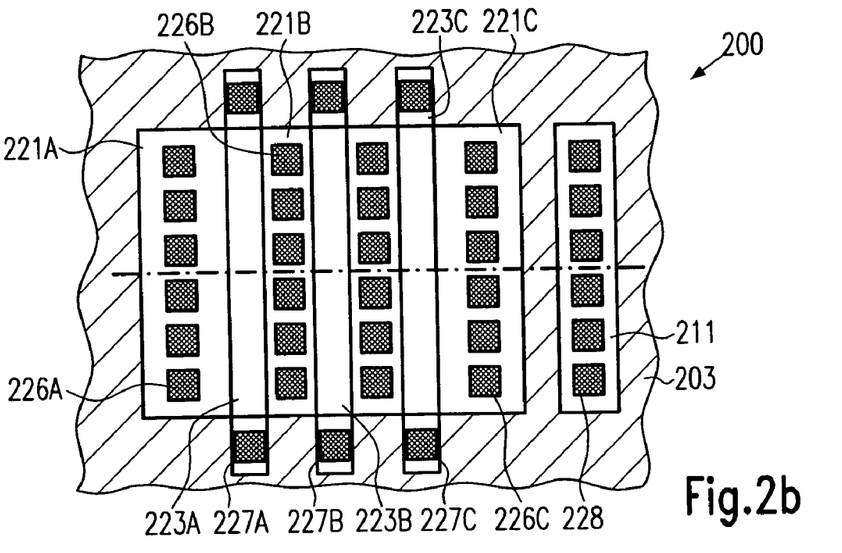

FIG. 2b schematically shows a top view of the test structure 200. As shown therein, contact plugs 226a, 226b, 226c are formed on the respective source and drain regions 221a, 221b and 221c. Similarly, respective contact plugs 227a, 227b and 227c are formed on end portions of the gate electrodes 223a, 223b and 223c. Furthermore, contact plugs 228 are formed on the well contact layer 211. The respective contact plugs may be formed within an appropriate insulating layer (not shown) and may be comprised of an appropriate metal, such as tungsten, with a thin suitable barrier metal formed between the tungsten and the insulating material of the insulating layer. It should be appreciated that the number, the form and the composition of the contact plugs may depend on the specific design rules and requirements of the circuit elements under consideration.

Again referring to FIG. 2a, it is to be noted that the contact plugs 226a–c, 227a–c and 228 are not shown in FIG. 2a for the sake of clarity and are instead represented by the terminals p1a, p1b, p1c, p2a, p2b, p2c and p3, respectively. As previously explained with reference to FIGS. 1a–1b, the terminals p1a–c, p2a–c and p3 represent any contact plugs and metal lines required to electrically connect the respective source/drain regions, gate electrodes and the well contact with respective metal pads that are formed over the substrate 201 after completion of the test circuit elements and any required metallization levels for establishing the required electrical connections therein. As previously noted, these metal pads exhibit dimensions that allow access by external test instruments and thus have significantly greater dimensions than the test structure 200. Hereinafter, these metal pads are referred to as contact pad 1 which is connected to the source and drain regions 221a–c, contact pad 2, which is connected to the gate electrodes 223a–c, and contact pad 3, which is connected to the well contact 210.

A typical process flow for forming the test structure 200 may comprise substantially identical process steps as used in manufacturing corresponding circuit elements in product areas of the substrate 201. Accordingly, the characteristics of the well region 202, i.e., the complex dopant profile thereof, the characteristics of the drain and source regions 221a–c, the characteristics of the gate electrode 223a–c, i.e., the dopant profile thereof, the dimensions thereof and the like, and the characteristics of the gate insulation layers 224a–c, i.e., the thickness and the composition thereof, may substantially represent the characteristics of the corresponding product circuit elements under consideration. In other embodiments, however, one or more specifically designed test circuit elements may be formed within the semiconductor structure 200 to assess the reliability of a dielectric material. For instance, a plurality of gate electrodes may be formed on a dielectric layer without the formation of highly doped source and drain regions so as to produce a capacitor structure having a plurality of first electrode contacts and a single second electrode (the well contact 210). The terminals p1a–c, and thus the first contact pad 1, may then become obsolete, thereby still further reducing the number of contact pads and hence the floor space occupied by the test structure 200. In other embodiments, the test circuit elements 220a–c may differ in some aspects, such as the thickness of the respective gate insulation layers 224a–c.

Moreover, the test circuit elements 220a–c may represent P-channel transistors or N-channel transistors having similar or different dimensions so as to assess the reliability of various circuit elements used in the actual product areas of the substrate 201. In other embodiments, a plurality of test structures 200 may be provided on the substrate 201, wherein each of the plurality of semiconductor structures 200 may comprise substantially the same type of test circuit elements, whereas the type of test circuit elements may vary among some of the plurality of semiconductor structures 200.

Regarding the process flow for forming the semiconductor structure 200, the same criteria apply as previously pointed out with reference to FIGS. 1a–b. That is, similar process steps as used for actual circuit elements may be used, wherein design changes corresponding to specifics of the structure 200 are taken into account.

During operation, the source and drain regions 221a–c may be connected to a first electric potential via the terminals p1a–c, and thus via the first contact pad. For instance, if the test circuit elements 220a–c are considered as N-channel transistors, the first electric potential may represent a ground potential. Similarly, the well contact 210 may be connected to a second electric potential via the terminal p3 and thus via the third contact pad. The second electric potential may also represent ground potential. Finally, the gate electrodes 223a–c may be connected to a third electric potential via the corresponding terminals p2a–c, and thus via the second contact pad, wherein the third electric potential is selected so as to create an inversion channel in the respective channel regions 222a–c. Typically, the voltage created by the difference between the first and second potentials and the third potential is selected significantly higher than a corresponding operating voltage of actual product devices so as to accelerate the occurrence of any electric breakdowns of the corresponding gate insulation layers. Additionally, the semiconductor structure 200 may be exposed to predefined environmental conditions, such as a specified temperature range, humidity, ambient pressure, external high energetic radiation, and the like, to simulate various operating conditions of actual devices.

Upon application of the desired voltage to the gate electrodes 223a–c, a signal indicating the occurrence of an electrical breakdown of one or more of the gate insulation layers 224a–c may be monitored. For instance, the current required for establishing the desired gate voltage may be monitored and may represent a signal indicative of an electrical breakdown event.

Figure 2C:
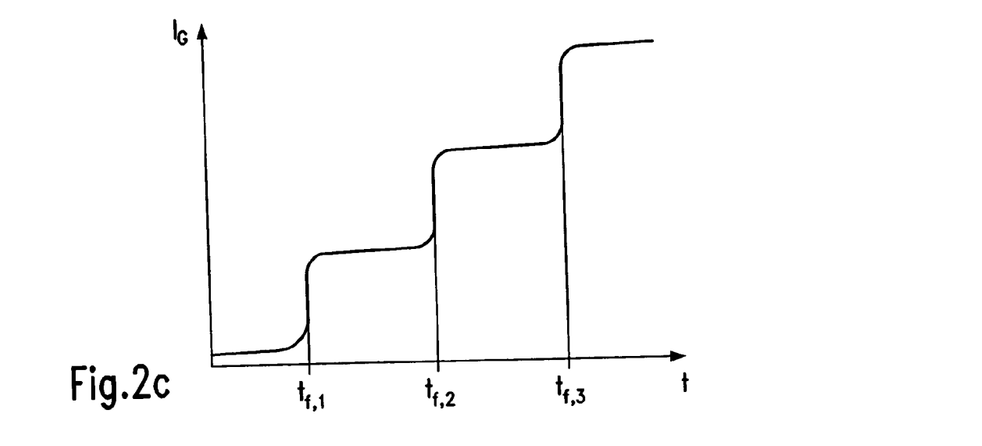
FIGS. 2c–2d schematically show graphs illustrating the dependency of the leakage currents versus the time to failure and a Weibull graph, respectively, for the test structures shown in FIGS. 2a–2b.

FIG. 2c schematically shows the progression of the gate current $I_g$ supplied to the gate electrodes 223a–c when an electric breakdown in each of the test circuit elements 220a–c occurs. During time 0–time $t_{f1}$, it is assumed that the gate insulation layers 224a–c behave as desired and the corresponding gate current $I_g$ represents the normal leakage current through the gate insulation layers 224a–c. It is to be noted that the leakage current $I_g$ in this time interval may not necessarily exactly represent the static leakage current of a corresponding number of actual product devices since typically actual transistor devices are operated—when set to a static closed state—with a voltage applied between the source and drain regions, which may slightly affect that total electric field prevailing at the respective gate insulation layer. However, the time to electrical breakdown of one or more of the gate insulation layers 224a–c may nevertheless be indicative of the lifetime of actual devices. At time point $t_{f1}$, it is assumed that, for instance, the test circuit element 220b has an increased leakage current, indicating the failure of the gate insulation layer 224b. Therefore, the entire current $I_g$ rapidly increases and may finally saturate within a given range that depends on the damage that has occurred within the gate insulation layer 224b. At time point $t_{f2}$, it is assumed that a further gate insulation layer, for example the gate insulation layer 224a, exhibits an electric breakdown that leads to a further rapid increase of the current $I_g$. After a certain time interval, the gate insulation layer 224c may fail and therefore lead to a further rapid increase of the current $I_g$. Consequently, three independent failure events may be observed by only using the three contact pads 1, 2 and 3, thereby resulting in a ratio of failure event to contact pad of 1, whereas, in the conventional case described with reference to FIGS. 1a–1c, the ratio is 1:3. By providing more than three test circuit elements, the ratio may be further increased. For instance, the number of test circuit elements 220a–c may be increased to an extent that still allows one to reliably distinguish individual failure events by corresponding steps in the gate leakage current $I_g$. That is, as long as significant steps may be identified in the total gate current $I_g$, even if one or more of gate insulation layers that already experienced an electrical breakdown further degrade in the course of time and cause a gradually increasing leakage current, the number of test circuit elements may be increased. Advantageously, the number of test circuit elements is no longer increased when the floor space occupied by the test circuit elements substantially equals the floor space occupied by the contact pads 1, 2 and 3. Moreover, the number of test circuit elements in the semiconductor structure 200 may be selected so as to conform with the current drive capability of the involved contact plugs and metal lines establishing the electrical contact between the respective regions of the circuit elements 220a–c and the corresponding contact pads 1, 2 and 3. For instance, the number of circuit elements is selected so that the electrical resistance of the lines conducting the total gate current $I_g$ does not significantly influence the current flow, even if all of the test circuit elements 220a–c experience a failure event. By "not significantly affecting the total gate current $I_g$," it is meant that the individual current steps caused by individual failure events are reliably identifiable even for the last circuit elements having a failure event.

Figure 2D:
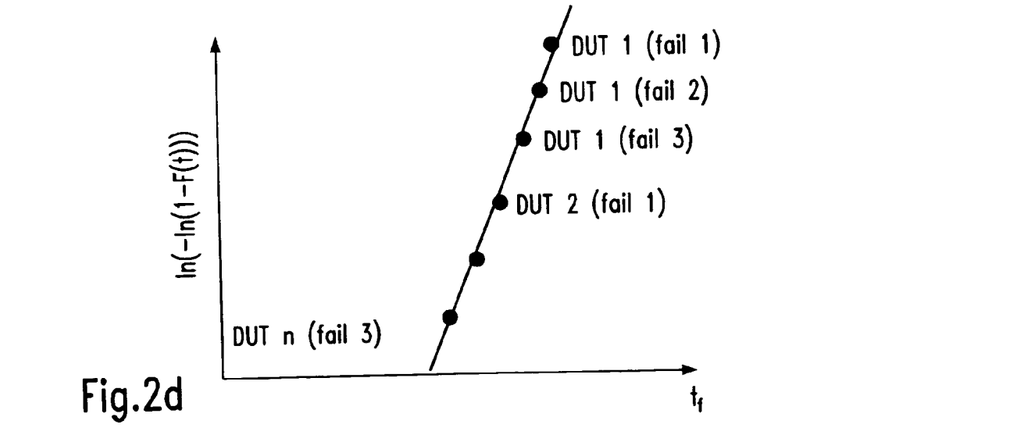

FIG. 2d schematically shows a Weibull plot as is typically used for assessing the lifetime of devices. Herein, the time to failure is plotted vs. the Weibull function for a plurality of test structures 200, each containing, for example, three test circuit elements 220a–c. The various test structures are denoted as DUT1 (device under test) to DUTn, wherein the failure events for each DUT are indicated as "fail 1 to 3." From the graph of FIG. 2d, a typical expected lifetime for given operating conditions may be estimated.

Figure 3:
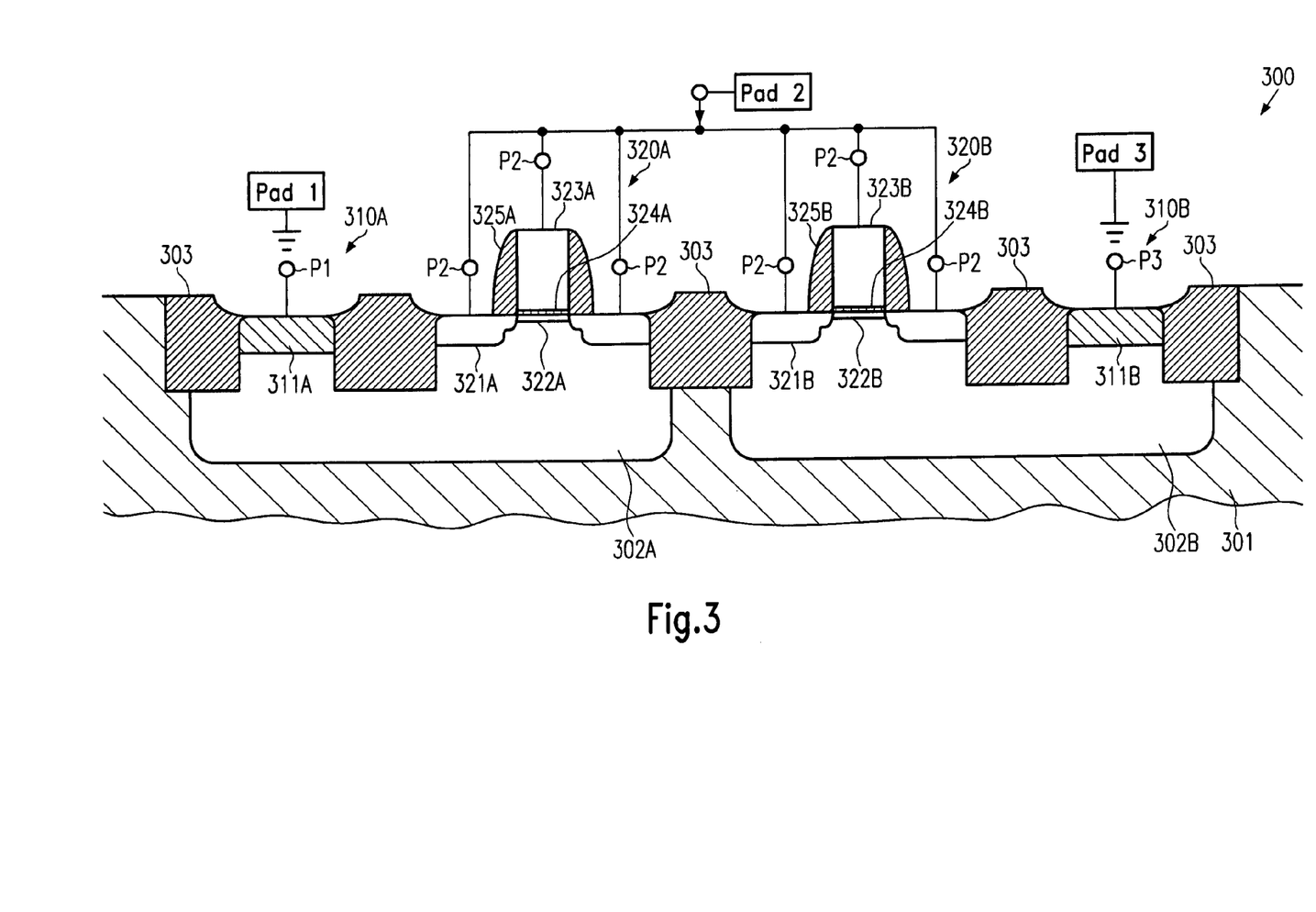
FIG. 3 schematically shows a cross-sectional view of an integrated test structure in accordance with still further illustrative embodiments of the present invention.

FIG. 3 schematically shows a cross-sectional view of a semiconductor structure 300 in accordance with further illustrative embodiments of the present invention. The semiconductor structure 300 comprises a substrate 301, which may be any substrate as already pointed out with reference to FIGS. 1a–1c and 2a–2d. The substrate 301 may comprise a first well region 302a and a second well region 302b, each comprising a specified dopant profile. For example, the first well region 302a may substantially be P-doped so that an N-channel transistor may be formed in the well 302a. Similarly, the second well region 302b may represent an N-doped region that is appropriate for forming a P-type transistor structure. In and on the first and second well regions 302a, 302b are formed respective well contacts 310a, 310b including corresponding highly doped contact layers 311a, 311b. A first test circuit element 320a, for example in the form of an N-channel transistor, may be formed in and on the well region 302a, wherein the test circuit element 320a comprises source and drain regions 321a, a channel region 322a, a gate insulation layer 324a, a gate electrode 323a, and corresponding sidewall spacers 325a. Similarly, the test circuit element 320b may comprise substantially the same components, which are correspondingly denoted. Moreover, as already previously explained, terminals p1, p2 and p3 are shown to represent any contact plugs, conductive metal or polysilicon lines, vias, and the like, that establish an electrical connection to respective contact pads 1, 2 and 3. In the embodiment shown in FIG. 3, the drain and source regions 321a, 321b and the gate electrodes 323a, 323b are electrically connected to the contact pad 2, whereas the first well region 302a is connected to the pad 1 via the well contact 310a. The second well region 302b is connected to the pad 3 via the well contact 310b. It should be appreciated that again the semiconductor structure 300 is depicted in a simplified manner. For example, not depicted are the silicide portions usually formed in the drain and source regions and the gate electrode of the circuit elements 320a, 320b, and any conductive lines and vias formed in the circuit level or in any above-lying metallization layers that are required to provide for the necessary electric connections. Although not illustrated, for instance, the gate electrodes 323a and 323b may be connected within the first metallization layer, whereas the respective electric connection between the gate electrodes 323a, 323b and the corresponding drain and source regions may be established as local interconnects. However, any other appropriate design may be used to create different types of test circuit elements 320a, 320b within the single test structure 300. In other embodiments, the drain and source regions 321a, 321b may be omitted, or may not be equipped with the terminals p2.

During operation, appropriate electrical potentials may be applied to the contact pads 1, 2 and 3 so as to establish respective inversion channels within the channel regions 322a, 322b. For instance, a reference potential such as ground potential may be applied to the contact pad 2, which is connected to the source and drain regions and the gate electrodes of the test circuit elements 320a, 320b. A negative voltage may then be supplied to the contact pad 1 when the test circuit element 320a is an N-channel transistor. Similarly, a positive voltage may be applied to the contact pad 3 when the test circuit element 320b represents a P-type transistor. Although it may be advantageous in terms of measurement time to apply the voltages at the contact pad 1 and the contact pad 3 simultaneously, these voltages may also be supplied subsequently or intermittently, wherein the frequency for switching on the respective voltage applied to the contact pad 1 and/or the contact pad 3 may be selected as considered appropriate. During the application of an appropriate test voltage to the contact pads 1, 2 and 3, the current flowing through contact pads 1 and 2 on the one side, and flowing through the contact pads 2 and 3 on the other hand, may be monitored so as to determine the occurrence of a failure of the respective gate insulation layers 324a, 324b. Thus, reliability tests may be performed on, for example, complementary CMOS transistors that are manufactured in accordance with typical process flows as used in actual product devices within a single test structure, thereby requiring a reduced number of contact pads compared to the conventional test structure shown in FIGS. 1a–1b.

In other embodiments, a plurality of test circuit elements 320a may be formed in the first well region 302a and a corresponding plurality of test circuit elements 320b may be formed in the second well region 302b. The occurrence of any failure events for each type of test circuit element 320a, 320b may then be similarly monitored as explained with reference to FIG. 2c.

In the above embodiments, the leakage current $I_g$ is used as the failure signal for identifying a failure event. In other embodiments, other variables may be detected. For instance, voltage changes may be monitored when a constant current is impressed. In other examples, voltage pulses may be supplied and corresponding changes in the pulse form may be used in assessing a deterioration of the dielectric under consideration.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
commonly connecting source and drain regions of a plurality of transistor elements to a first electric potential by a first contact pad;
commonly connecting gate electrodes of said plurality of transistor elements to a second electric potential by a second contact pad;
connecting a common well region of said plurality of transistor elements to a third electric potential by a third contact pad; and
assessing a reliability of gate insulation layers of said plurality of transistor elements by monitoring a gate leakage current of said plurality of transistor elements.

2. A method, comprising:
commonly connecting source and drain regions and a gate electrode of at least one N-channel transistor structure and at least one P-channel transistor structure to a first electric potential by a first contact pad;
connecting a P-well region of said at least one N-channel transistor structure to a second electric potential by a second contact pad;
connecting an N-well region of said at least one P-channel transistor structure to a third electric potential by a third contact pad; and
assessing a reliability of gate insulation layers of said at least one N-channel transistor structure and said at least one P-channel transistor structure by determining a failure event.

3. The method of claim 2, wherein said second and third potentials are of opposite polarities.

4. The method of claim 3, wherein said second and third potentials are applied substantially simultaneously.

5. The method of claim 3, wherein said second and third potentials are applied sequentially.

6. The method of claim 5, wherein said second and third potentials are applied as pulses in an alternating manner.

7. The method of claim 2, wherein said failure event is determined by detecting abrupt changes of a signal indicative of a dielectric breakdown of a gate insulation layer of said at least one N-channel transistor structure and said at least one P-channel transistor structure.

8. The method of claim 7, wherein said signal represents a leakage current through said gate insulation layers.

* * * * *